United States Patent [19]

Nash et al.

[11] 4,169,231

[45] Sep. 25, 1979

[54] BURIED CHANNEL TO SURFACE CHANNEL CCD CHARGE TRANSFER STRUCTURE

[75] Inventors: J. Gregory Nash; Jan Grinberg; Paul O. Braatz, all of Los Angeles; Michael Waldner, Woodland Hills, all of Calif.

[73] Assignee: Hughes Aircraft Company, Culver City, Calif.

[21] Appl. No.: 948,946

[22] Filed: Sep. 20, 1978

Related U.S. Application Data

[63] Continuation-in-part of Ser. No. 835,565, Sep. 22, 1977, abandoned.

[51] Int. Cl.² ............... G11C 19/28; H01L 29/78
[52] U.S. Cl. ............................... 307/221 D; 357/24
[58] Field of Search ................. 357/24; 307/221 D

[56] References Cited

U.S. PATENT DOCUMENTS

| | | | |
|---|---|---|---|
| 3,792,322 | 2/1974 | Boyle et al. | 357/24 |
| 3,796,932 | 3/1974 | Amelio et al. | 357/24 |
| 3,858,232 | 12/1974 | Boyle et al. | 357/24 |
| 3,986,197 | 10/1976 | Ablassmeier | 357/24 |

OTHER PUBLICATIONS

Sequin et al., Charge Transfer Devices, Academic Press, N.Y., (7/75), pp. 11-15, 62-69, 101, 107-109, 243-247.

Theunissen, "Charge Transfer Devices, Part I, Physical Principles," Microelectronique, vol. 54, (8/74), pp. 317-324.

Sequin et al., "Linearity of Electrical Charge Injection into Charge Coupled Devices," IEEE J. Solid-State Circuits, vol. Sc-10, (4/75), pp. 81-92.

*Primary Examiner*—William D. Larkins
*Assistant Examiner*—Gene M. Munson
*Attorney, Agent, or Firm*—Robert M. Wallace; W. H. MacAllister

[57] ABSTRACT

A buried channel to surface channel charge coupled device includes a blocking gate and a transfer gate situated between a buried channel gate and a surface gate for transferring electron charge from the buried channel to the surface channel. The blocking gate is located over the buried channel and the transfer gate straddles the buried and surface channels. The blocking gate serves to overcome the potential barrier associated with buried to surface channel transfers.

4 Claims, 5 Drawing Figures

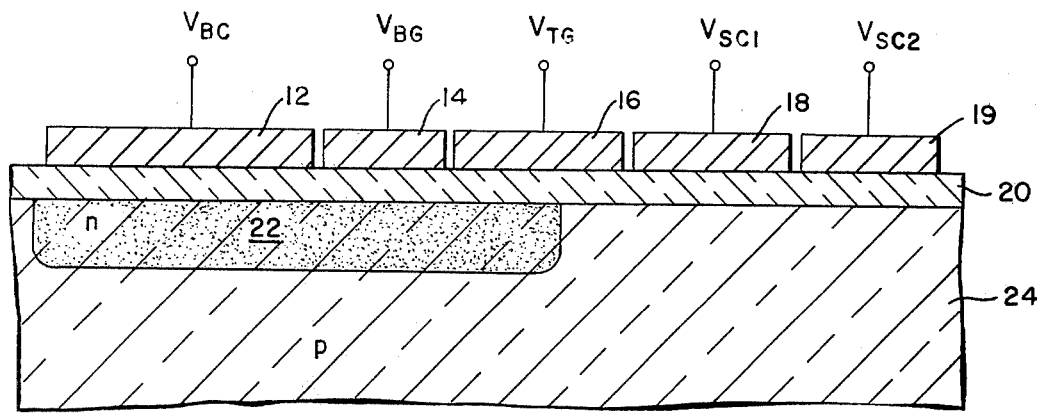
Fig. 3a.
Fig. 3b.
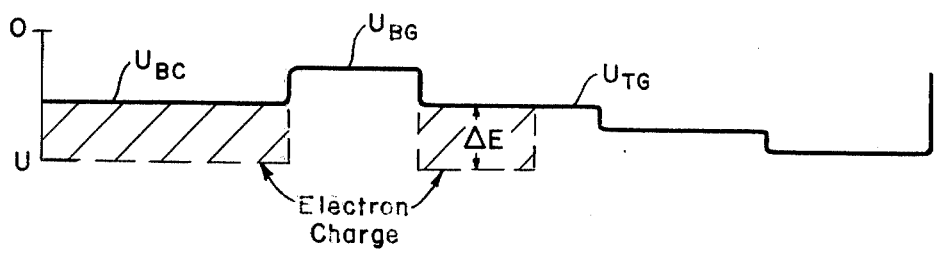
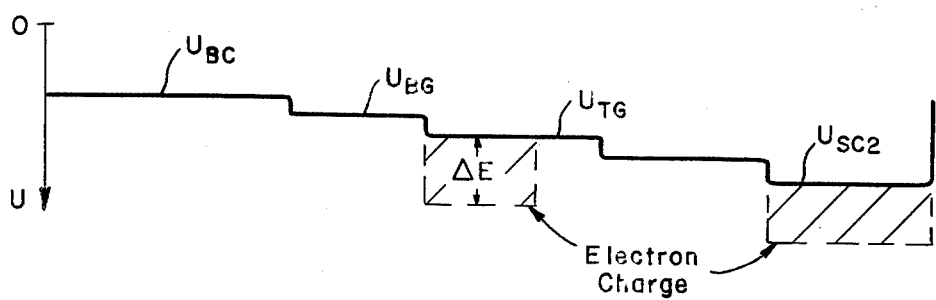
Fig. 3c.

BURIED CHANNEL TO SURFACE CHANNEL CCD CHARGE TRANSFER STRUCTURE

CROSS-REFERENCE TO RELATED APPLICATIONS

This is a continuation-in-part of copending patent application, Ser. No. 835,565, filed Sept. 22, 1977, now abandoned.

BACKGROUND OF THE INVENTION

1. Field of the Invention

This invention relates to charge coupled device, (CCD) and more particularly to an interface which permits charge to flow between BCCD and SCCDs.

2. Description of the Prior Art

Buried channel CCD (BCCD) and surface CCD (SCCD) structures each have unique characteristics that can make one more suitable than the other for a given device application. For example, the BCCD can operate at higher speeds and has a higher transfer efficiency, whereas the SCCD has a better charge-carrying capacity, is easier to build, has greater linearity in its input, and generally exhibits less leakage current. Historically, CCD devices have been fabricated either entirely as buried channel or entirely as surface channel; however, one can conceive of device structures which could benefit from the inclusion of both types of CCDs. For example, if a series-parallel-serial (SPS) array were needed for an application that required high speed and large charge-carrying capacity, one solution would be to make the input and output register a BCCD and the parallel section a SCCD. The difficulty that arises when a buried channel and a surface channel are combined in the same circuit is that an interface must be designed between the two channels that will overcome the potential barrier created by a buried to surface channel transfer thereby allowing charge to flow between them. This barrier is attributable to the use of opposite semiconductor types in the buried and surface channel regions, i.e., p-doped and n-doped materials. The purpose of the present invention is to permit the charge to flow between the buried channel and surface channel.

SUMMARY OF THE INVENTION

The buried channel to surface channel charge coupled device, in accordance with the invention, consists of a blocking gate and transfer gate situated between a buried channel gate and a surface channel gate. The blocking gate is situated above the buried channel and the transfer gate straddles the buried channel and surface channel. The blocking gate traps an amount of charge under the transfer gate such that the potential barrier caused by the buried to surface channel transfer is overcome. When the buried to surface channel transfer is to occur, the potential of the buried channel gate is raised until it is smaller than the potential on the blocking gate. This causes charge to spill over from the region under the buried channel gate through the regions under the blocking and transfer gates to the region under the surface channel gate, due to the fact that the lowest potential minimum is under the surface channel gate.

Accordingly, it is an object of the present invention to provide a charge transfer structure which transfer electron charge from a buried channel to a surface channel in a CCD.

BRIEF DESCRIPTION OF THE DRAWINGS

These and other objects, features and advantages of this invention will become apparent from the following portion of the specification, the claims, and the attached drawings, wherein like reference numerals refer to like parts and in which:

FIG. 3(a) shows the buried channel to surface channel CCD charge transfer structure. FIG. 3(b) is a graph of the potential minimums under the transfer gates of FIG. 3(a) immediately prior to charge transfer, and FIG. 3(c) is a graph of the potential minimums under the transfer gates of FIG. 3(a) immediately after charge transfer.

DETAILED DESCRIPTION OF THE PREFERRED EMBODIMENT

Figure 1:
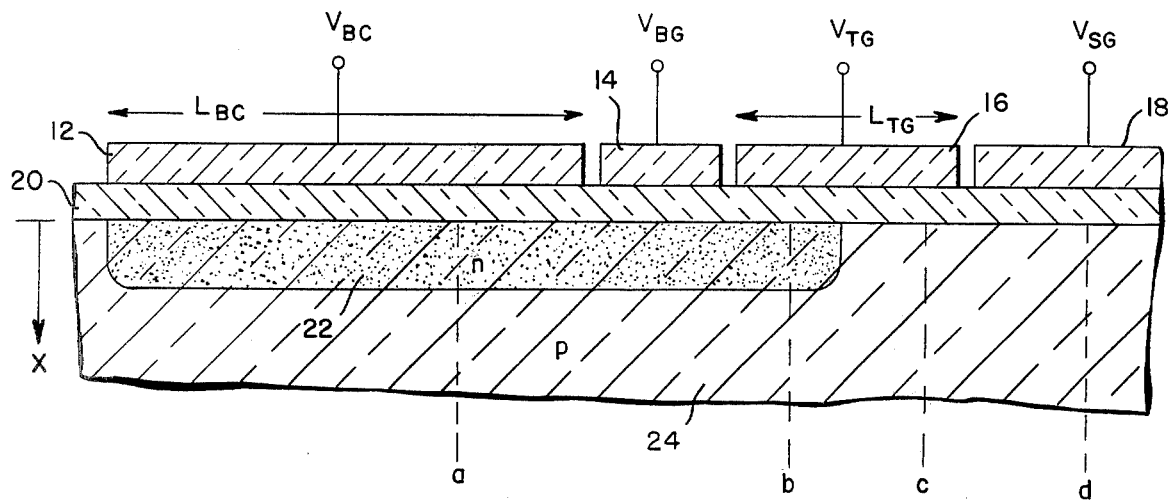
FIG. 1 shows the buried channel to surface channel CCD charge transfer structure of the present invention.

Referring first to FIG. 1, the buried-to-surface channel structure 10 consists of a buried channel gate 12, a blocking gate 14, a transfer gate 16, and a surface channel collecting gate 18. Insulating material 20 is situated between gates 12, 14, 16, 18 and buried channel 22 and surface channel 24. Buried channel 22 is comprised of n-type material and surface channel 24 is comprised of p-type material. Buried channel gate 12 and blocking gate 14 are located above the n-type material 22, while the transfer gate 16 straddles the n-type material 22 and the p-type material 24. The surface channel gate 18 is located above the p-type material 24. It is, of course, to be understood that the placement of the doped materials could be reversed; the blocking gate 14 and buried channel gate 12 could be situated above the p-type material and the surface channel gate situated above the n-type material. Only one transfer gate, gate 16 is shown. However, two transfer gates, one over the n-type material and another over the p-type material, might be used instead, but due to the lateral movement of the p-n junction during diffusion, the p-n junction would never remain aligned with respect to the two transfer gates. Therefore, only one transfer gate 16 is used in structure 10.

Figure 2:
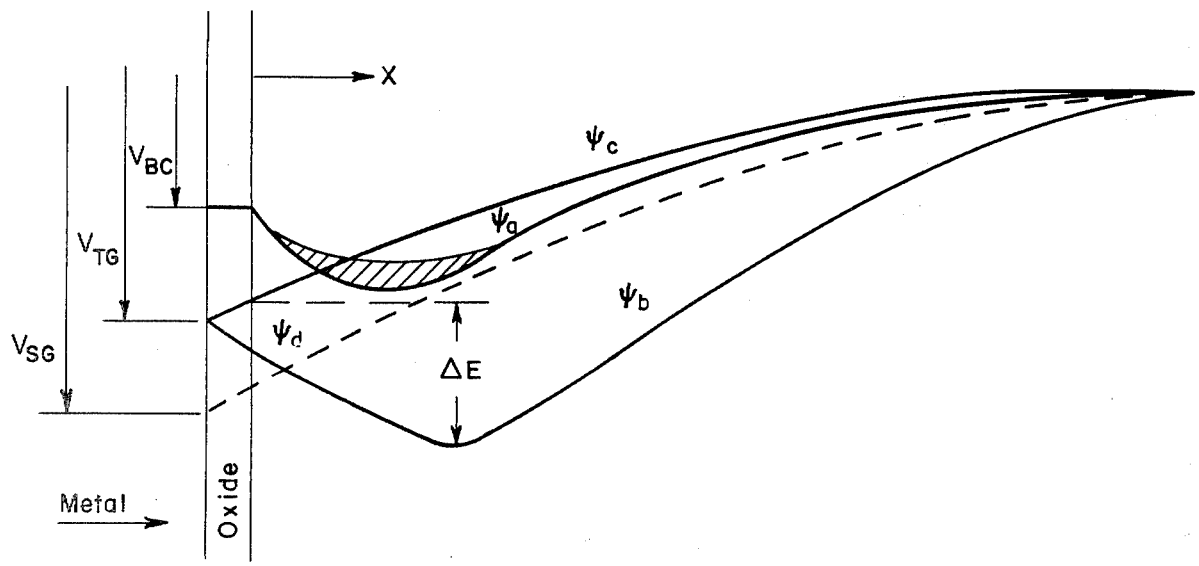
FIG. 2 is a graph of the variation of electron potential $\psi$ versus the distance x into the substrate.

FIG. 2 shows the variation of electron potential, $\psi$, versus distance through the metal and the oxide, into the structure, X, at various points (a-d) along buried-to-surface channel structure 10 of FIG. 1 for a case in which there is no blocking gate 14. The various gate voltages indicated in FIG. 1, the buried channel gate voltage, $V_{BC}$, the transfer gate voltage ($V_{TG}$), and the surface channel gate voltage ($V_{SG}$), are shown on the graph. The charge in the buried channel under gate 12 is indicated by a bucket in graph $\psi_a$. When the voltage of transfer gate 16 is increased to become larger than the voltage on gate 12, the charge stored in the bucket will naturally flow to a lower electron potential which is under the buried channel portion of the transfer gate 16 shown by $\Delta E$ on graph $\psi_b$. A comparison between the electron potential $\psi_c(X)$ at point c as a function of X with the electron potential $\psi_b(X)$ at point b as a function of X, shows that regardless of how much extra voltage is added to the transfer gate voltage $V_{TG}$, $\psi_c(X) > \psi_b(X)$, and thus there is a potential barrier equivalent to $\Delta E$ preventing the electron charge to flow into the surface channel under gate 18. In order to overcome the barrier, $\psi_b$(Oxide) at the oxide-substrate interface=$\psi_c$(Oxide) at the substrate. This may be done by increasing the buried channel gate width $L_{BC}$, so that $L_{BC}$ is much greater than $L_{TG}$, the width of the transfer gate 16 over the buried channel. Transfer would then occur because there will be sufficient charge available under the buried channel portion of the transfer gate to raise the electron potential $\psi_b$(Oxide) to $\psi_c$(Oxide), at which point electron charge will spill over into the surface channel under gate 18. A certain amount of electron charge will remain in the buried channel 22 under the transfer gate 16 i.e., all the charge required to raise $\psi_b$(Oxide) to $\psi_c$(Oxide); however, since $L_{BC} >> L_{TG}$ the remaining charge under the transfer gate will be small compared with the total charge transferred. Once this charge has been transferred to the surface channel under gate 18, the charge can then be clocked conventionally into the surface channel 24.

However, there will be some degradation in transfer efficiency from buried to surface channels as a result of charges trapped underneath the transfer gate 16. Therefore, a blocking gate such as gate 14, shown in FIGS. 1 and 3a, is added between the buried channel gate 12 and the transfer gate 16 to trap an amount of charge equivalent to ΔE underneath the transfer gate 16, thereby eliminating the potential barrier associated with the p-n junction.

FIG. 3 shows the gate structure 10 and, in FIGS. 3a and b, the corresponding minimum potentials (U) underneath each gate. In normal operation, prior to a buried-to-surface transfer, the potential under the blocking gate 14 is less in magnitude than the potential under the buried channel gate 12, shown by $U_{BG}$, preventing the charge trapped under the transfer gate 16 from flowing back into the buried channel 22. The buried-to-surface transfer is affected by raising the buried channel potential $U_{BC}$ by decreasing $V_{BC}$ until $U_{BC} > U_{BG}$. Charge wil then spill over from the region under gates 14 and 16 into the region under gate 18, since the potential minimum is lowest there.

In FIG. 3(a) the gate structure has two surface channel gates 18 and 19. These two gates are used to allow the potential of the electron charge in the buried channel to be lowered to that in the surface channel without charge spillage back into the buried channel. This is accomplished by lowering the magnitude of the voltage on surface gate 18 after the charge transfer, thereby isolating the buried the surface channel regions.

In FIG. 3(b), a large voltage is applied to the buried channel gate 12 and a relatively smaller voltage is applied to the blocking gate 14 in order that the information signal may be placed into buried channel 22 first thereby isolating the charge in the buried channel. Once the buried channel is loaded with charge, the magnitude of $V_{BC}$ is lowered below $V_{BG}$ so that the potential minimums shown in FIG. 3(c) result. As shown in FIG. 3(c), all of the charge from the buried channel then flows under blocking gate 14 into the area under the buried channel portion of transfer gate 16. Sufficient charge equivalent portion of transfer gate 16. Sufficient charge equivalent to ΔE is always trapped on the buried channel side of the transfer side 16 in order to keep the potential minimum there equal to the potential minimum on the surface channel side of the transfer gate 16. Thus, none of the charge flowing from under the buried channel gate is trapped under the transfer gate during the transfer. All the buried channel charge is then collected under the surface channel gate 19 because the potential is lowest there. Therefore, due to the addition of the blocking gate 14, high transfer efficiency may be obtained.

Although the device which has just been described appears to afford the greatest advantages for implementing the invention, it will be understood that various modifications can be made thereto without going beyond the scope of the invention, it being possible to replace certain elements by other elements capable of fulfilling the same technical functions therein.

What is claimed is:

1. In a buried channel and surface channel semiconductor device having a plurality of electrodes distributed over the surface of a semiconductor substrate for processing signal charge as both majority and minority charge carriers, the buried channel receiving the signal charge as majority charge carriers of the buried channel, said device also having means for applying potentials to those particular ones of said electrodes located over said buried channel so as to cause said particular electrodes to repel said majority charge carriers so that transfer and storage is away from the semiconductor surface, the surface channel receiving the signal charge from the buried channel, said device further having means for applying potentials to those of said electrodes which are over said surface channel so as to attract the same majority charge carriers, said surface channel conveying the signal charge as minority charge carriers of the surface channel so that transfer and storage occurs at the semiconductor surface, the improvement comprising:

first and second conductivity-type semiconductor regions in said semiconductor substrate constituting the buried channel and the surface channel, respectively;

one input electrode above said first conductivity-type region for applying the majority charge carriers to said buried channel;

a transfer gate electrode straddling said first and second conductivity-type regions said transfer gate electrode being situated between the electrodes which repel majority charge carriers and the electrodes which attract majority charge carriers;

a blocking gate electrode above said first conductivity-type region situated between said input electrode and said transfer gate electrode;

means for applying potentials to said transfer gate electrode and to said blocking gate electrode, so as to cause said blocking gate electrode to trap sufficient majority charge carriers in said first conductivity-type region directly underlying said transfer gate electrode to eliminate a potential barrier associated with the junction of said first and second conductivity-type regions; and at least one surface channel gate electrode located above said second conductivity-type region for collecting the minority charges in said surface channel.

2. The device of claim 1 wherein said first and second conductivity types are p-doped and n-doped respectively and said signal charge carriers are holes.

3. The device of claim 1 wherein said first and second conductivity types are n-doped and p-doped respectively and said signal charge carriers are electrons.

4. The device of claim 1 wherein said at least one surface channel gate electrode comprise a plurality of surface channel gate electrodes.